(12) United States Patent
Nakashimo et al.

(10) Patent No.: US 6,489,749 B1
(45) Date of Patent: Dec. 3, 2002

(54) BATTERY STATE MONITORING CIRCUIT HAVING DIFFERENTIATING CIRCUIT

(75) Inventors: Takao Nakashimo, Chiba (JP); Hiroshi Mukainakano, Chiba (JP)

(73) Assignee: Seiko Instruments Inc. (JP)

( * ) Notice: Subject to any disclaimer, the term of this patent is extended or adjusted under 35 U.S.C. 154(b) by 0 days.

(21) Appl. No.: 09/806,288

(22) PCT Filed: Jul. 28, 2000

(86) PCT No.: PCT/JP00/05130

§ 371 (c)(1),
(2), (4) Date: Aug. 24, 2001

(87) PCT Pub. No.: WO01/11753

PCT Pub. Date: Feb. 15, 2001

(30) Foreign Application Priority Data

Aug. 5, 1999 (JP) ............................................. 11-222849

(51) Int. Cl.[7] ............................................. H01M 10/46
(52) U.S. Cl. ......................................... 320/134; 320/136
(58) Field of Search .................................. 320/134, 136, 320/132, 127, 128, 135

(56) References Cited

FOREIGN PATENT DOCUMENTS

JP 09-247852 * 9/1997

* cited by examiner

Primary Examiner—Edward H. Tso
(74) Attorney, Agent, or Firm—Adams & Wilks

(57) ABSTRACT

The present invention relates to an improvement in the safety and a reduction in a current consumption in a battery device which is capable of calculating the remaining amount of a lithium ion secondary battery. If the charging and discharging current becomes equal to or lower than a given value, circuits including a current monitoring circuit operate so as to reduce the current consumption. In this situation, the current monitoring circuit stops to function. A control circuit is connected with a differentiating circuit, and if a voltage between both ends of the sense resistor changes, a charging and discharging current monitoring circuit is again operated. With the above solving means, the current consumption can be suppressed, and a precision in the current monitor can be enhanced.

13 Claims, 12 Drawing Sheets

| | D5 | D4 | D3 | D2 | D1 | D0 |
|---|---|---|---|---|---|---|
| RESET | 0 | 0 | 0 | 0 | 0 | 0 |
| SWITCH ELEMENT ON | 1 | 0 | 0 | 1 | 1 | 1 |
| REGULATOR ON | 1 | 1 | 1 | 0 | 0 | 0 |
| CHARGE CURRENT MONITOR | 1 | 0 | 1 | 1 | 0 | 0 |
| DISCHARGE CURRENT MONITOR | 1 | 0 | 1 | 1 | 0 | 0 |
| VOLTAGE MONITOR OF BATTERY 7 | 0 | 0 | 1 | 0 | 0 | 0 | we# BATTERY STATE MONITORING CIRCUIT HAVING DIFFERENTIATING CIRCUIT

TECHNICAL FIELD

The present invention relates to a technique of improving the safety and reducing a current consumption in a battery device and in a battery state monitoring circuit capable of calculating the remaining amount of a secondary battery such as lithium ion secondary battery.

BACKGROUND ART

As a conventional battery state monitoring circuit, there has been known a device shown in a circuit block diagram of FIG. 2. This structure is disclosed in, for example, Japanese Patent Application Laid-open No. Hei 9-312172, "Battery Pack, Charger, Charging System and Charging Method." This relates to a battery device which is called "Smart Battery System".

The lithium ion secondary battery used in the smart battery system requires an over-charge protecting circuit since it is not provided with a self-protecting operation unlike a nickel/cadmium battery. A battery device 22A is equipped with a battery voltage monitoring circuit 4A for detecting a battery voltage and a switch element 12 for stopping the charging from an external charger 21.

The battery device 22A controls the indication of the remaining amount of each of secondary batteries 7 to 10, the stop of charging, etc. A microcomputer 6A is inputted with an output voltage V3a of a current monitoring circuit 3A and an output voltage V4a from a battery voltage monitoring circuit 4A. The microcomputer 6A is capable of calculating the charging currents and the discharging currents of the secondary batteries 7 to 10 and the respective battery voltages based on the inputted voltages V3a and V4a to calculate the remaining amounts of the secondary batteries 7 to 10. Also, the microcomputer 6A controls the on/off operation of the switching elements 12 and 13 in accordance with the state (normal, over-charging, over-discharging and over-current) of the secondary battery. That is, the microcomputer 6A controls the protecting function (over-charging protection, over-discharging protection and over-current protection) of the battery device 22A.

In the battery device 22A, a battery state monitoring circuit 14A has a total battery voltage VBa of the secondary batteries 7 to 10 as a power supply.

The microcomputer 6A is inputted with an output V1a of a regulator 1A as a power supply of the microcomputer 6A. since the total battery voltage VBa of the secondary batteries 7 to 10 changes in accordance with the status of a load 20 connected between a plus terminal 15 and a minus terminal 17 of the battery device 22A, the total battery voltage Vba is regulated to a constant voltage V1a such as 3.3 V or 5.0 V by a regulator 1A and then supplied to the microcomputer 6A.

The microcomputer 6A is inputted with an output current I3a (in the for m of a voltage V3a) of the current monitoring circuit 3A and calculates the remaining amount of the battery in accordance with the output current I3a. In general, the output of the current monitoring circuit 3A is an analog value which needs to be converted into a digital value in order to calculate the remaining amount of battery by the microcomputer 6A. For that reason, an A/D convertor circuit is installed in the microcomputer 6A.

As described above, because the power supply of the battery state monitor circuit 14A is supplied from the secondary batteries 7 to 10, an electric power is consumed from those secondary batteries.

Also, the charging and discharging voltage/current from the secondary batteries are not constant but largely change in a short period of time in accordance with the status of the load 20 or the status of the charger 21. For that reason, in order that the battery state monitoring circuit 14A monitors the charging and discharging current from the secondary batteries 7 to 10 with a higher precision, the operating frequency of the A/D convertor installed in the microcomputer 6A needs to be set as high. As the operating frequency of the A/D convertor is set as high, the current consumption of the microcomputer 6A is further increased, to thereby further increase the consumption of a power from the secondary batteries.

Under the above circumstances, there has been proposed a method of stopping the A/D convertor within the microcomputer 6A and the charging/discharging current monitoring function as a technique in which, in the battery state monitoring circuit 14A, when the charging and discharging current of the secondary batteries 7 to 10 is small, for example 0 to 10 mA, as compared with the battery capacity of the secondary batteries, the current consumption of the entire circuit including the charging and discharging monitoring circuit 3A is reduced, to thereby suppress the power consumption of the secondary batteries 7 to 10.

In this state, the consumed current of the battery state monitoring circuit 14A is reduced down to 1/10 to 1/1000. In this way, the state where the consumed current is reduced is called "power save mode".

However, certain conditions are required when the operation is returned from the power save mode to the normal operation. A function of returning the battery state monitoring circuit 14A to the normal operation is called "wake up". The condition for waking up is set, for example when "the charging and discharging current of the secondary batteries 7 to 10 exceeds 1 ampere." Under that condition, the minus pole voltage V21a of the charger 21A is a small value lower than 50 mV.

In order to detect such a fine voltage, the current monitoring circuit 3A must make an offset voltage small so that the fluctuation of the detected wake-up voltage is reduced. Also, since the current monitoring circuit 3A operates even in the power save mode, the current consumption must be reduced. The current monitoring circuit of this type is complicated in structure and cannot be realized by a simple and inexpensive circuit.

DISCLOSURE OF THE INVENTION

In order to solve the above problems, according to the present invention, a filter is disposed between a sense resistor terminal and a control circuit, which is capable of reducing the current consumption of the entire circuit when the charging and discharging current value becomes small and detecting the current when the charging and discharging current becomes large.

The circuit is structured in such a manner that only the current monitoring circuit operates when the charging and discharging current value becomes small, and the sense resistor terminal and an input terminal of the control circuit current are connected with a capacitor so that all the functions for detecting the remaining amount of a battery start to be executed when the charging and discharging current changes.

BEST MODE FOR CARRYING OUT THE PRESENT INVENTION

A description will be given in detail of the present invention with reference to the accompanying drawings.

Figure 1:
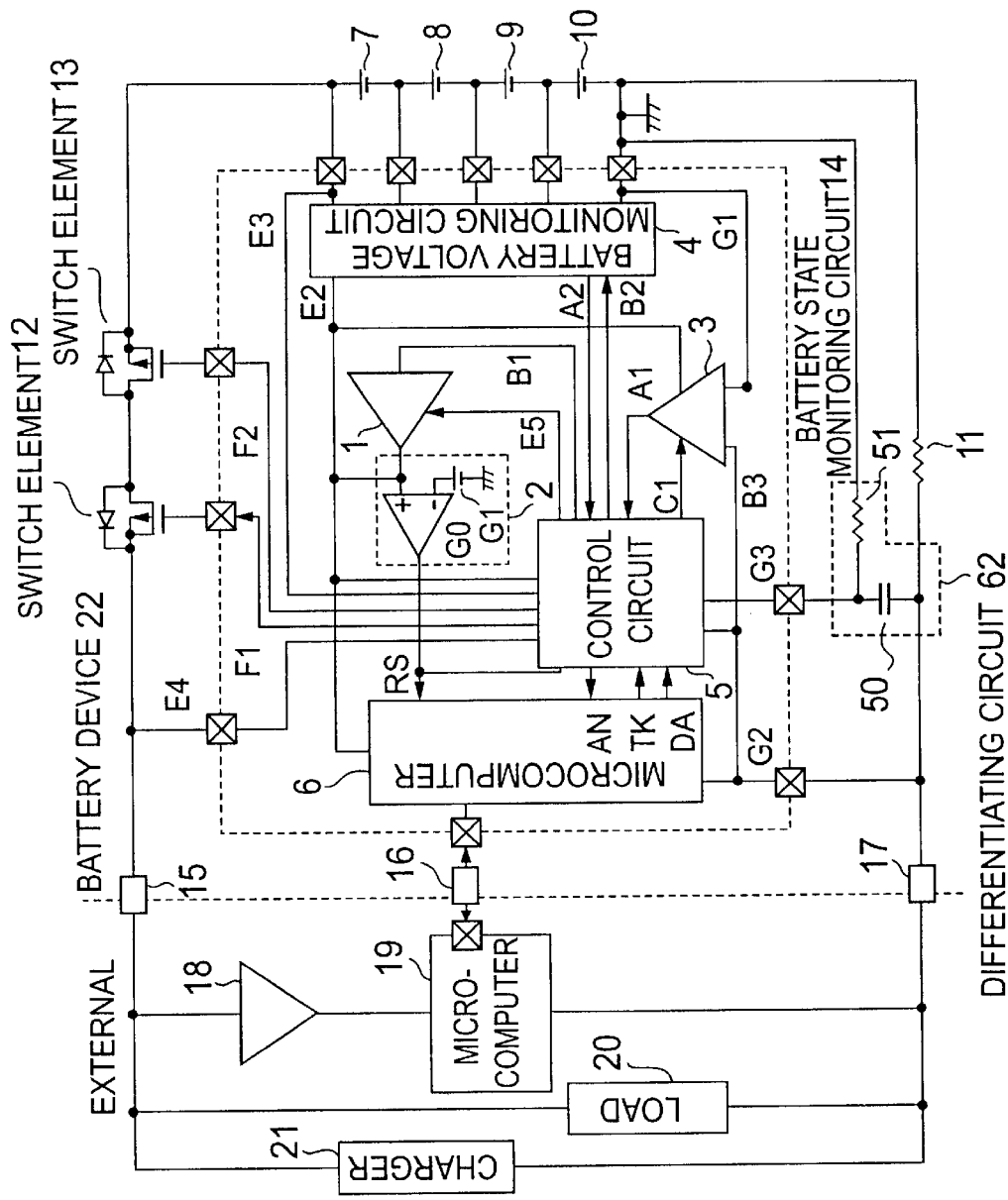
FIG. 1 is a diagram showing a battery state monitoring circuit in accordance with the present invention and a battery device using the battery state monitoring circuit.

FIG. 1 shows a structural example of a battery state monitoring circuit in accordance with the present invention and a battery device using the battery state monitoring circuit. Hereinafter, this embodiment of the present invention will be described with reference to FIG. 1. Referring to FIG. 1, a battery device 22 includes a plurality of secondary batteries 7 to 10 (for example, lithium ion secondary batteries) connected in series to or in parallel with each other, a battery state monitoring circuit 14, switching elements 12 and 13 for control of a charging and discharging current, etc. In this embodiment, those four secondary batteries 7 to 10 are connected in series to each other, and a negative pole of the secondary battery 10 is connected to a sense resistor 11. The other terminal of the sense resistor 11 is connected to a minus terminal 17 of the battery device 22. A positive pole of the secondary battery 7 is connected to a switching element 13 made up of an FET (field effect transistor) and a diode. The switching element 12 is connected in series to the switching element 13, and the switching element 12 is also connected in series to a plus terminal 15 of the battery device 22.

The switching elements 12 and 13 control the charging operation by a charger 21 connected to the plus terminal 15 and the minus terminal 17 of the battery device 22 and the discharging operation from the secondary batteries 7 to 10 to a load 20 in accordance with a control signal from the battery state monitoring circuit 14. For example, when the operation of charging the secondary batteries 7 to 10 is to be inhibited, the switching element 12 needs to be turned off, whereas when the operation of discharging the secondary batteries 7 to 10 are to be inhibited, the switching element 13 needs to be turned off.

The switching elements 12 and 13 may be connected between the negative pole of the secondary battery 10 and the sense resistor 11. In this case, the kind (n-channel, p-channel), etc., of the switching elements (for example, FETS) can be changed so as to be adaptive to locations to which those switching elements are connected or to an inputted control signal. Similarly, the sense resistor 11 may be connected between the plus terminal 15 side of the battery device 22 and the switching element 12.

The battery state monitoring circuit 14 is made up of a regulator 1, a voltage detecting circuit 2, a current monitor circuit 3, a battery voltage monitoring circuit 4, a control circuit 5, a microcomputer 6, and so on.

Figure 3:
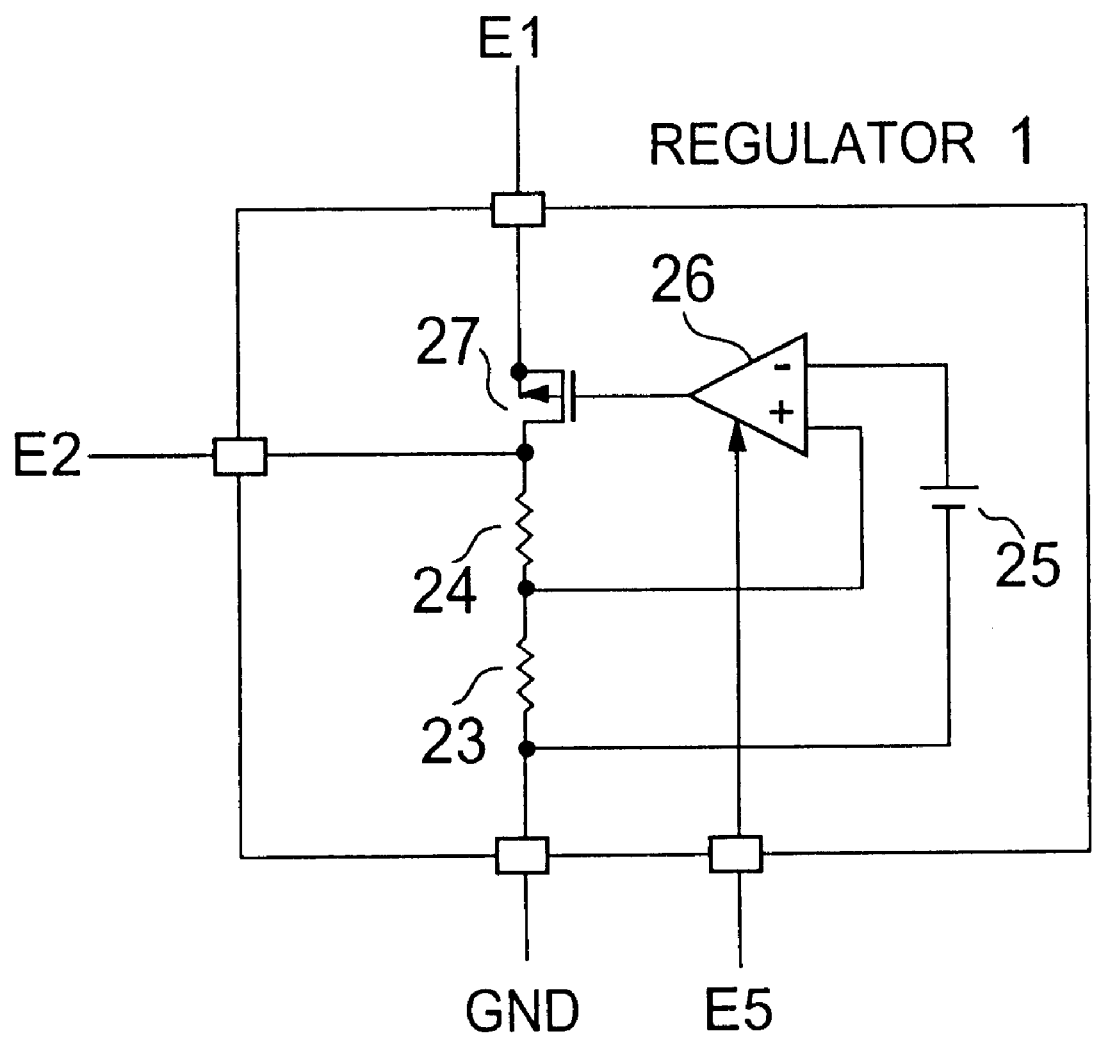
FIG. 3 is a diagram showing a regulator used in the battery state monitoring circuit in accordance with the present invention and the battery device using the battery state monitoring circuit.

The regulator 1 is made up of, for example, as shown in FIG. 3, resistors 23 and 24, a reference voltage 25, a comparator 26 and a p-channel driver 27, and functions in such a manner that an output voltage E2 is always kept constant (for example, 3.3 V or 5 V) even if an input voltage E1 fluctuates. Also, a control signal E5 enables the on/off of an output of the regulator 1 to be controlled.

The output of the regulator 1 is connected with the voltage detecting circuit 2. The voltage detecting circuit 2 is made up of a comparator G0 and a reference voltage G1, for example, as shown in FIG. 1. When the output voltage E2 of the regulator 1 becomes equal to or lower than a set voltage (reset detection voltage), an output RS changes from high to low. The microcomputer 6 can prevent malfunction in advance by stopping the operation of the output RS changes. As usual, this control method is called "reset". The reset detection voltage of the microcomputer 6 is the minimum operating voltage at which the microcomputer 6 does not malfunction (run away). For example, in general, if the operating voltage of the microcomputer 6 is 5 V, the reset detection voltage becomes a value of about 4.6 V.

The current monitoring circuit 3 amplifies a voltage between the minus terminal 17 of the battery device 22 and the minus terminal of the secondary battery 10. The sense resistor 11 is disposed between the minus terminal 17 of the battery device 22 and the minus terminal of the secondary battery 10, and the current monitoring circuit 3 amplifies a voltage developed between both ends of the sense resistor 11 by the charging and discharging current to a voltage readable by the microcomputer 6 and then transmits the voltage thus amplified to the control circuit 5.

Since the resistance of the sense resistor 11 is generally small to several tens mΩ, the current monitoring circuit 3 amplifies a voltage developed between both ends of the sense resistor 11 by several tens to several hundreds times to supply the voltage thus amplified to the control circuit 5.

Figure 4:
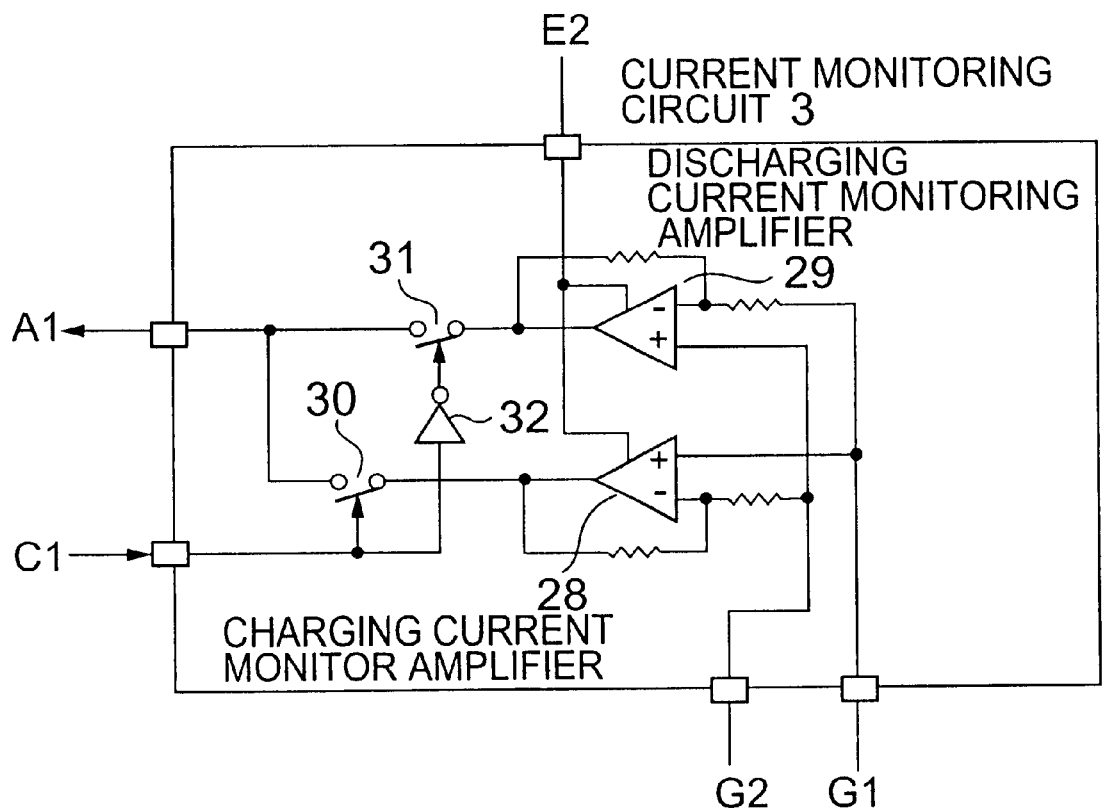
FIG. 4 is a diagram showing a current monitoring circuit used in the battery state monitoring circuit in accordance with the present invention and the battery device using the battery state monitoring circuit.

FIG. 4 shows a structural example of the current monitoring circuit 3. The voltage (a potential difference between G1 and G2) developed at both ends of the sense resistor 11 is amplified by a charging current monitor amplifier 28 and a discharging current monitor amplifier 29. The on/off operation of a switching element 30 connected to the charging current monitor amplifier 28 and a switching element 31 connected to the discharging current monitor amplifier 29 are changed over in response to a signal C1, whereby a voltage proportional to the charging current from the charging current monitor amplifier 28 or a voltage proportional to the discharging current from the discharging current monitor amplifier 29 is outputted from A1.

The battery voltage monitoring circuit 4 detects the respective voltages of the secondary batteries 7 to 10 and converts those voltages into voltages readable by the microcomputer 6 and outputs the voltages thus converted as A2.

Figure 5:
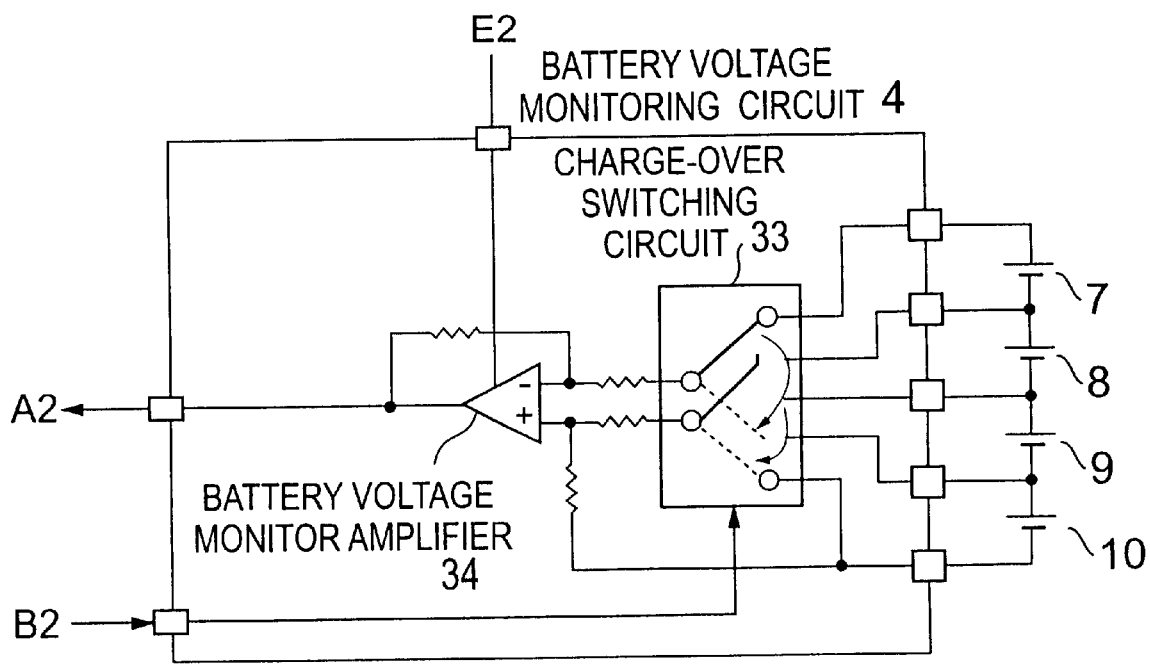
FIG. 5 is a diagram showing a battery voltage monitoring circuit used in the battery state monitoring circuit in accordance with the present invention and the battery device using the battery state monitoring circuit.

FIG. 5 shows an example of the battery voltage monitoring circuit 4. The battery voltage monitoring circuit 4 is made up of a change-over switching circuit 33, a battery voltage monitor amplifier 34, etc. Each of the battery voltages of the secondary batteries 7 to 10 is selected by the change-over switching circuit 33, converted into a voltage readable by the microcomputer 6 by the battery voltage monitor amplifier 34 and then outputted as a voltage A2. In this situation, it is determined which battery should be selected in accordance with the control signal B2 controlled by the microcomputer 6, and the voltages of the respective batteries are sequentially outputted. Although the control signal B2 is drawn by one line in FIG. 5, the control signal B2 may be constituted by the collection of a plurality of signals. Also, in the figure, the change-over switch within the change-over switching circuit 33 is schematically shown, and other structures may be applied if the switch can output the battery voltages one by one.

The microcomputer 6 in the embodiment of the present invention as shown in FIG. 1 has a function of monitoring the battery voltage, the charging current and the discharging current of the secondary batteries 7 to 10 and a function of calculating the remaining amount of the secondary batteries 7 to 10 from those information.

The microcomputer 6 in the embodiment of the present invention as shown in FIG. 1 has a function of monitoring the battery voltage, the charging current and the discharging current of the secondary batteries 7 to 10 and a function of calculating the remaining amount of the secondary batteries 7 to 10 from such information.

Also, the microcomputer 6 monitors the respective battery voltages and the discharging currents of the secondary batteries 7 to 10 and controls the on/off operation of the switching elements 12 and 13 in accordance with the voltage and the discharging current of the respective secondary batteries, to thereby protect the battery device 22. In order to detect the charging current and the discharging current of the batteries, the microcomputer 6 conducts the A/D conversion. In this case, if the current value is to be accurately monitored, the current consumption becomes large. This will be described with reference to FIGS. 9 and 10.

Figure 9:
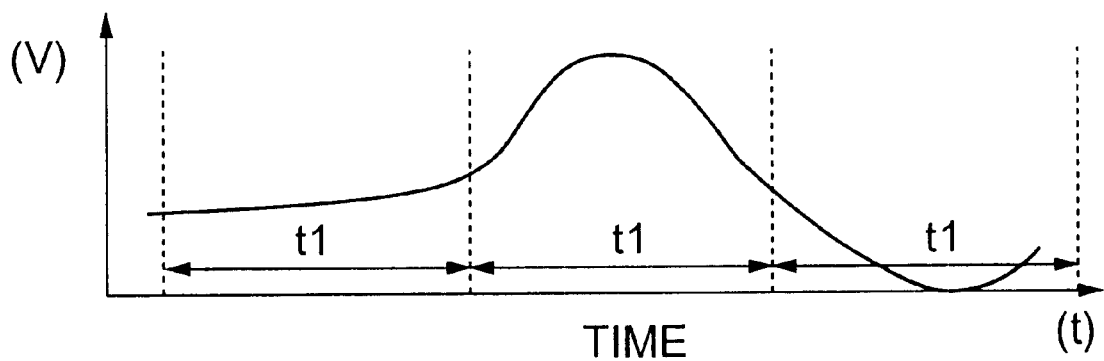
FIG. 9 is a graph showing a relationship of a charging and discharging current monitor circuit, an A/D convertor circuit and a charging and discharging current.
Figure 10:
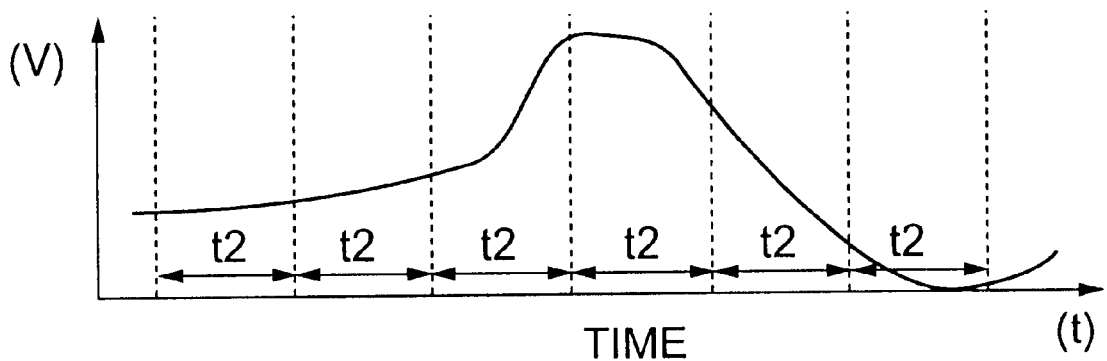
FIG. 10 is a graph showing a relationship of the charging and discharging current monitor circuit, the A/D convertor circuit and the charging and discharging current.

FIG. 9 shows a case in which the output signal of the current monitoring circuit 3 is A/D converted by the microcomputer 6 at intervals of a time t1 whereas FIG. 10 shows a case in which the output signal of the current monitoring circuit 3 is A/D converted by the microcomputer 6 at intervals of a time t2. The conditions of the charging and discharging current in FIGS. 9 and 10 are identical with each other, and the interval times of sampling satisfy t1>t2. In order to more accurately monitor the charging and discharging current by the A/D converting circuit, the operating intervals must be shortened. However, as the operating intervals t of the A/D converting circuit are shortened, the current consumption of the microcomputer 6 becomes larger. That is, there arises such a problem that as a precision in detection of the charging and discharging current, the current consumption becomes larger, whereas if the operating intervals are lengthened in order to suppress the current consumption, there is a problem that the precision in detection of the current is deteriorated.

Under the above circumstances, in order to solve the above problem, if the charging and discharging current becomes equal to or lower than a given value, the current consumption stops in the circuits except for the current monitoring circuit 3. In this method, the system becomes in a half-running state under a given condition. This state is called "sleep mode". The provision of the sleep mode reduces the current consumption of the entire system.

Since the system enters the sleep mode under the condition that the charging and discharging current is small, the current remaining amount monitoring function may be stopped. Therefore, the low current consumption and the high-precision battery remaining amount monitor can be realized with application of the sleep mode to the system.

Figure 12:
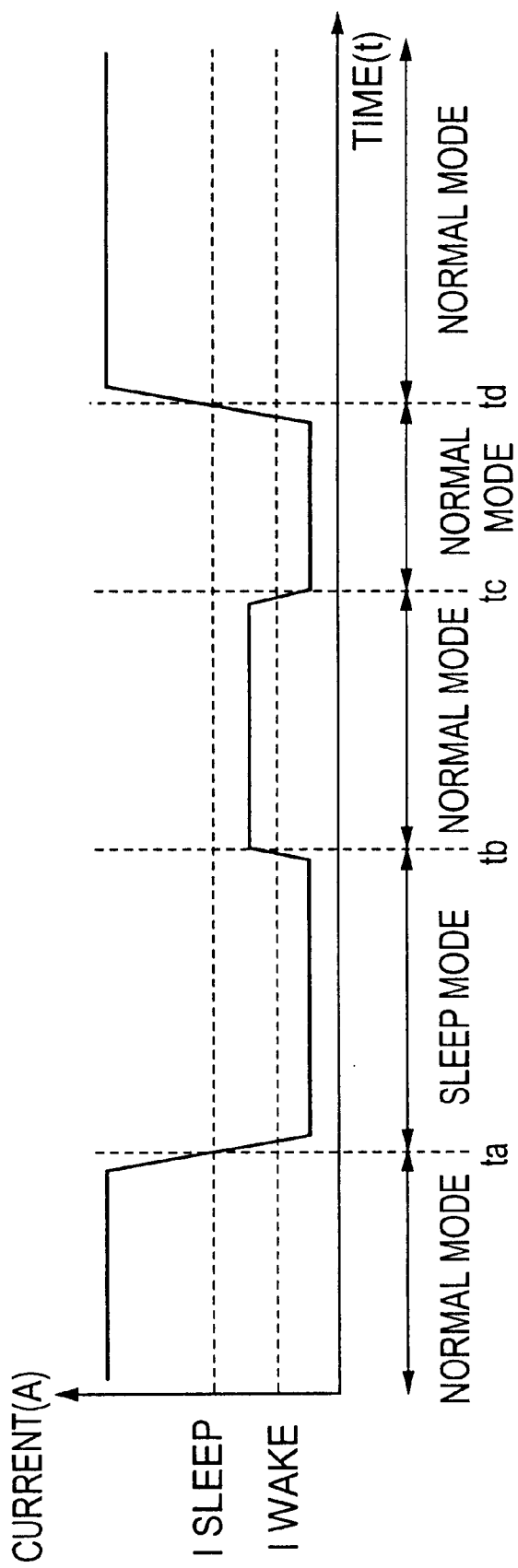
FIG. 12 is a timing chart of a sleep mode and a wake-up mode in the conventional battery state monitoring circuit and the battery device using the battery state monitoring circuit.

However, a problem with the system is a condition and a circuit which are released from the sleep mode. This will be described with reference to FIG. 12. In FIG. 12, till a time ta, since the charging and discharging current is large, the system conducts normal operation. At a time ta, the charging and discharging current becomes Isleep or less, and the battery state monitoring circuit 14 enters the sleep mode. In the sleep mode, the current consumption in the circuits except for the current monitoring circuit 3 stops, to thereby reduce the current consumption after the time ta.

Figure 2:
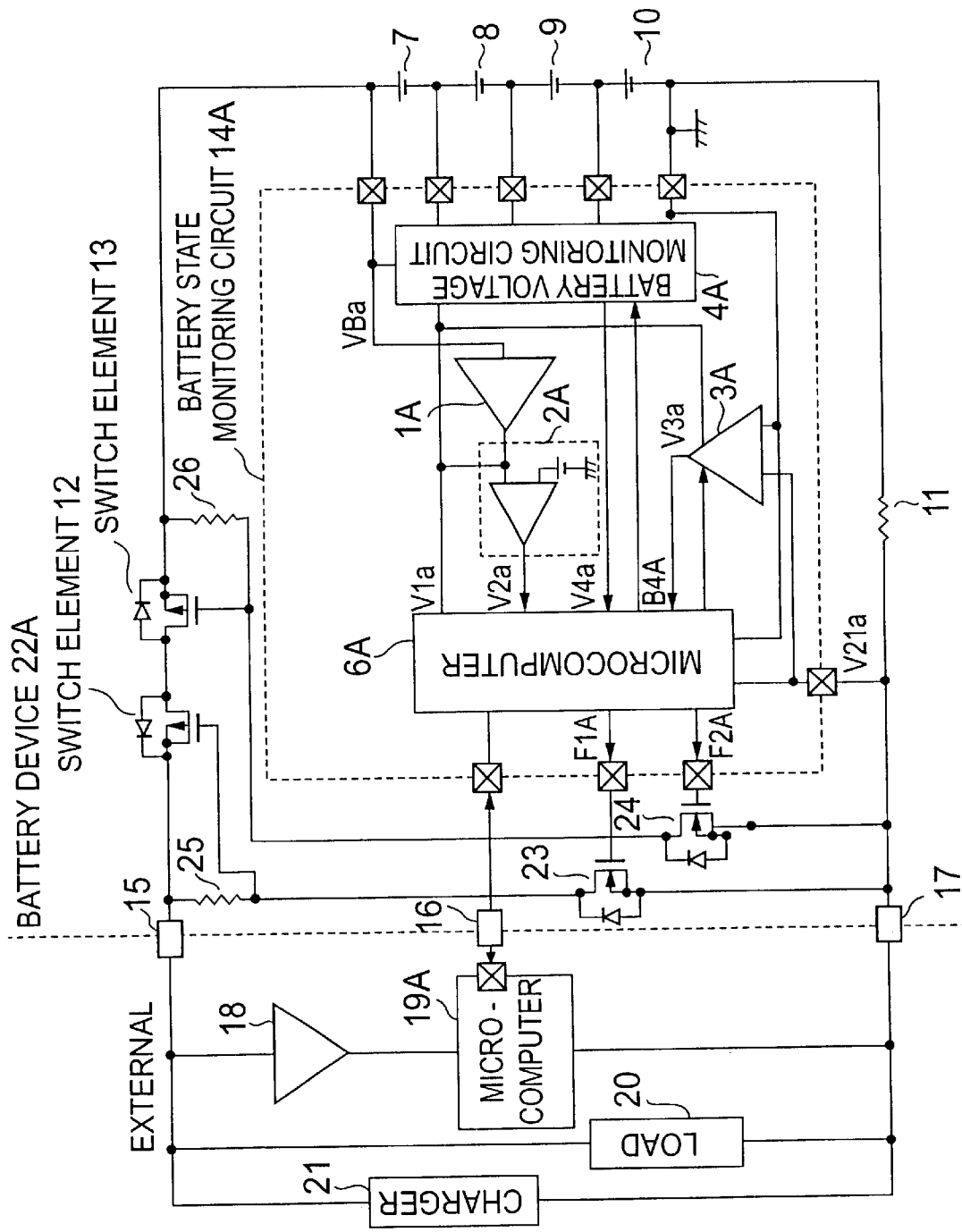
FIG. 2 is a diagram showing a conventional battery state monitoring circuit and a battery device using the battery state monitoring circuit.

In the conventional circuit shown in FIG. 2, the system is released from the sleep mode when the current value of Isleep or more occurs in a stationary state. For that reason, the charging and discharging current monitoring circuit 3A must continue the function during the sleep mode. For that reason, even if the sleep mode is provided, since the charging and discharging current needs to be monitored in order to release the sleep mode, the current monitoring circuit 3A consumes the current. That is, even if the sleep mode is provided, a reduction in the current consumption cannot be realized.

Under the above circumstance, the present invention releases the sleep mode by using a capacity coupling. In the present specification, a function of releasing the sleep mode is called "wake-up function".

As shown in FIG. 1, a differentiating circuit 62 is disposed between the sense resistor 11 and the control circuit 5. The differentiating circuit 62 is made up of a capacitor 50 and a resistor 51. An output of the differentiating circuit 62 is inputted to the control circuit 5 of the battery state monitoring circuit 14 as a signal G3. When the output A1 of the current monitoring circuit 3 becomes a given value or less, the control circuit 5 stops the function of the current monitoring circuit 3 in response to a signal C1 and instructs the current monitoring circuit 3 so as not to consume the current.

The control circuit 5 again starts the current monitoring circuit 3 when a signal is again inputted from the differentiating circuit 62 thereto.

Figure 13:
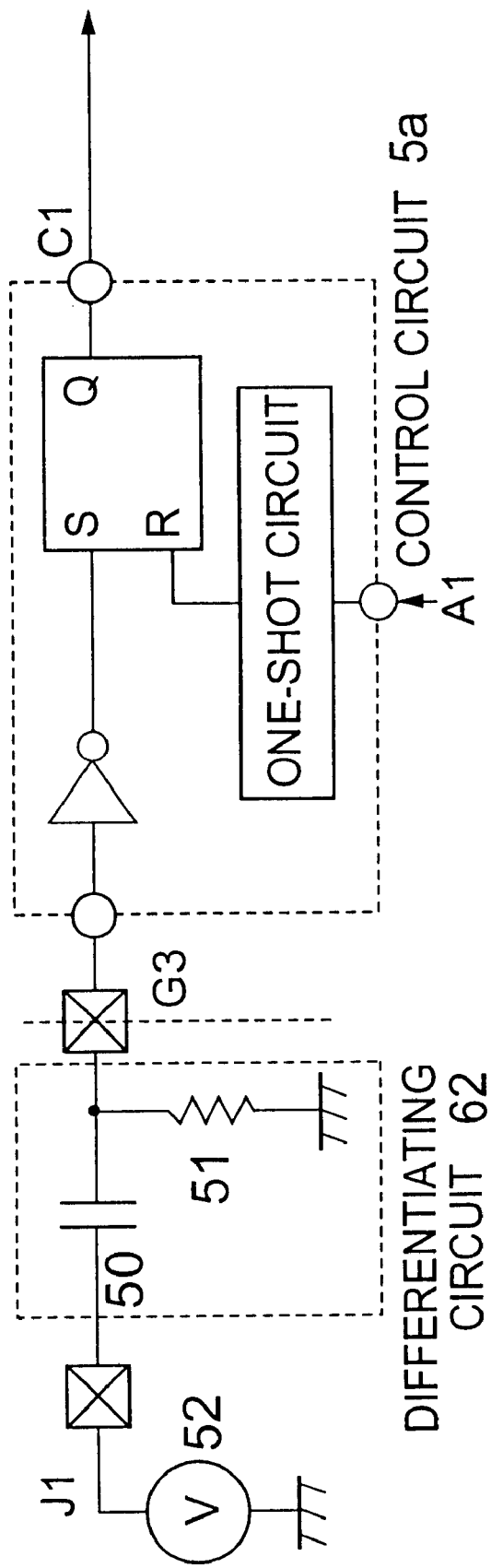
FIG. 13 is a diagram showing a circuit for the wake-up mode in the battery state monitoring circuit in accordance with the present invention and the battery device using the battery state monitoring circuit.
Figure 14:
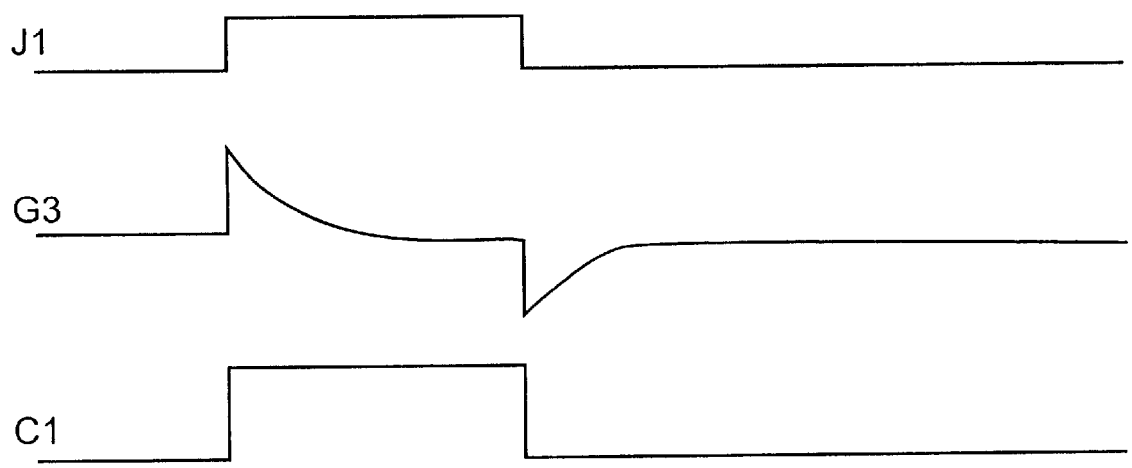
FIG. 14 is a timing chart of the circuit for the wake-up mode in the battery state monitoring circuit in accordance with the present invention and the battery device using the battery state monitoring circuit.

The functions of the differentiating circuit 62 and the control circuit 5 will be described in detail with reference to FIG. 13. Referring to FIG. 13, a voltage source 52 schematically shows a potential difference between both ends of the sense resistor 11 shown in FIG. 1. Also, a control circuit 5a shows a part of a circuit of the control circuit 5 shown in FIG. 1. In the figure, a change in voltage J1 generated in the voltage source 52 is transmitted through the differentiating circuit 62 as the signal G3. This appearance is shown in FIG. 14. The signal G3 is inputted to the control circuit 5a and outputted from the control circuit 5a as the signal C1.

The microcomputer 6 bears the safety of the protecting function (over-charging protection, over-discharging protection and over-current protection) in the battery device 22. For that reason, if the above protecting function is affected due to the stop, failure, etc., of the microcomputer 6, there is the possibility that the battery device 22 is damaged. Under the above circumstance, there is required a structure of keeping the battery device 22 in a safe state even if the microcomputer 6 stops or fails. In the case where the supply voltage is low such that the microcomputer 6 stops, or in the case where the supply voltage of the microcomputer 6 rises from a low voltage, for example, in the case where the supply voltage is returned from a state where it is lower than the reset detection voltage once, or in the case where the supply voltage of the microcomputer 6 rises from 0 V, the microcomputer 6 is reset by the output RS of the voltage detecting circuit 2 to turn off the switching elements 12 and 13.

Thereafter, when the charger 21 is connected to the battery device 22, and E2 which is the supply voltage of the microcomputer 6 becomes high to a voltage or higher at which the microcomputer 6 normally operates, command signals TK and DA are transmitted to the control circuit 5 from the microcomputer 6 so as to command the switching elements 12 and 13 to turn on.

As described above, since the switching elements 12 and 13 are kept off as long as the microcomputer 6 does not transmit the command for turning on the switching elements 12 and 13, the safety of the battery device 22 can be ensured.

Also, since when the microcomputer 6 is returned from the reset state, the switching elements 12 and 13 are in an off-state, and the switching elements 12 and 13 turn on after the microcomputer 6 completely stably operates, a precision in the calculation of the remaining amount of the secondary battery is improved.

Subsequently, the operation of this embodiment will be described. FIG. 9 is a graph showing the operating timing of this embodiment in which the axis of abscissa is a time and the axis of ordinate is a voltage, and shows a total battery voltage and an output voltage of the regulator 1.

The control circuit 5 has "the switching function of the supply voltage," "communicating function with the microcomputer and the control function of the respective circuit blocks," "switching function of the analog signal," and "data reset function" other than the wake-up function described above.

Figure 6:
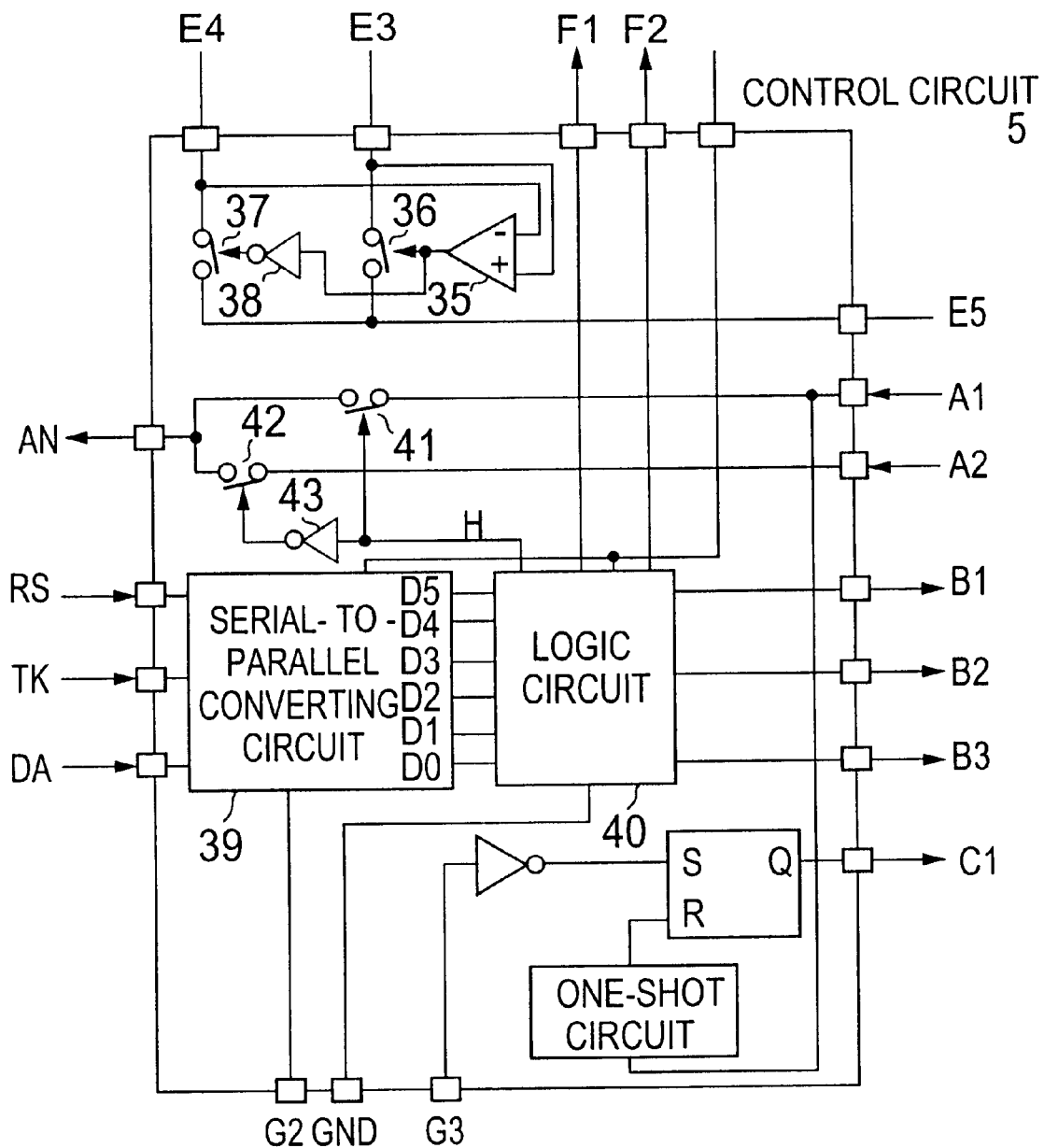
FIG. 6 is a diagram showing a control circuit used in the battery state monitoring circuit in accordance with the present invention and the battery device using the battery state monitoring circuit.

FIG. 6 shows a structural example of the control circuit 5. "The switching function of the supply voltage" in the control circuit 5 is to compare a voltage signal E4 of the charger with a total battery voltage signal E3 of the secondary batteries by a comparator 35, switch the switching elements 36 and 37 and output a higher voltage of those voltages to E5 as the supply voltage of the regulator 1.

"The communicating function with the microcomputer and the control function of the respective circuit blocks" in the control circuit 5 is to convert a serial data signal DA from the microcomputer 6 into parallel data signals D5 to D0 by a serial-to-parallel converting circuit 39 shown in FIG. 6 and also convert those parallel data signals D5 to D0 into control signals B1, B2, B3, F1, F2 and H to the respective circuit blocks by a logic circuit 40.

Figures 7, 8:
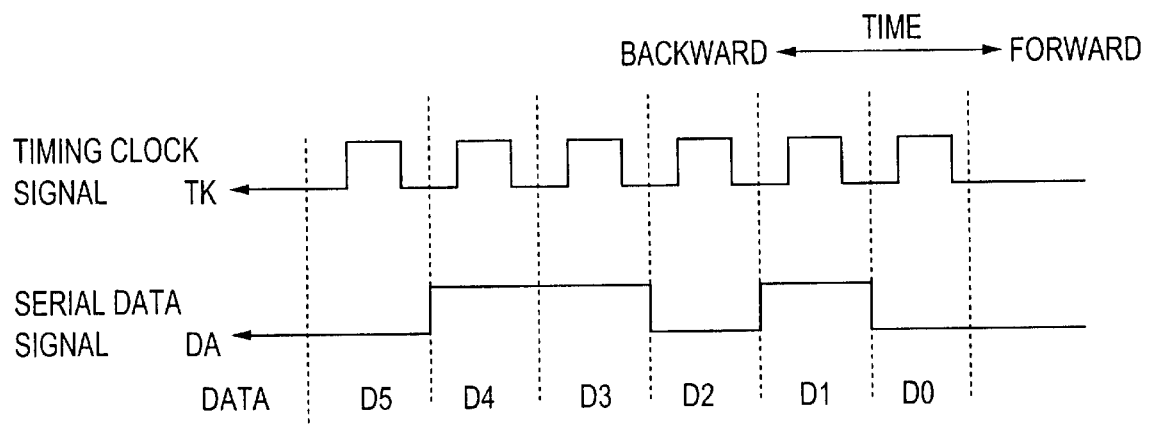
FIG. 7 is a timing chart diagram of a communication signal between a microcomputer and the control circuit diagram used in the battery state monitoring circuit in accordance with the present invention and the battery device using the battery state monitoring circuit.
FIG. 8 is a table showing command signals which are transmitted to the control circuit in the microcomputer used in the battery state monitoring circuit in accordance with the present invention and the battery device using the battery state monitoring circuit.

The communication signal from the microcomputer 6 is comprised of a timing clock signal TK and a serial data signal DA as shown in FIG. 7. The serial data signal DA when the timing clock signal TK is high is a command signal transmitted from the microcomputer 6.

In the example of FIG. 7, one command is structured by 6-bit serial data. The time axis of the signal is directed from the right side toward the left side, and D0 is temporally a preceding signal whereas D5 is temporally a succeeding signal. In this example, assuming that High is "1" and low is "0", D5 to D0 are set to a data of "011010".

FIG. 8 shows an example of a command of 6 bits. For example, in the case where the battery state monitoring circuit 14 is going to be initialized (reset), the serial data signal DA in which D5 to D0 are "000000", is transmitted from the microcomputer 6. In the case where the charging current is going to be monitored, the serial data signal DA in which D5 to D0 are "101100" is transmitted from the microcomputer 6. In FIGS. 7 and 8, the command from the microcomputer 6 is made up of 6 bits, but a command may be made up of bits other than 6 bits. In addition, in this example, the number of signals transmitted from the microcomputer 6 is two, that is, the timing clock signal TK and the serial data signal DA. However, control may be made by the number of signals other than two signals. Also, the command transmitted from the microcomputer 6 is not limited by FIG. 8, and the logic of High and Low may be different.

The logic circuit 40 in FIG. 6 operates to transmit the control signal to the respective circuit blocks (for example, the current monitor circuit 3). The logic circuit 40 logically synthesizes the parallel data signals D5 to D0 by using the logic elements (for example, a NAND circuit, a NOR circuit and an invertor) so as to coincide with the commands shown in FIG. 8. For example, in case of the command "101100" of the charging current monitor, the logic structure is made in such a manner that only the control signal B3 is High and other control signals B2, B2, F1, F2 and H are not changed.

The switching function of the analog signal in the control circuit 5 is to switch the switching elements 41 and 42 in response to the signal H and transmit any one of the output signal A1 of the current monitoring circuit 3 and the output signal A2 of the battery voltage monitoring circuit 4 in FIG. 1 to the microcomputer 6 as the analog signal AN. The output of the analog signal AN is selected from any one of the charging current, the discharging current and the respective battery voltages in response to the signals TK and DA from the microcomputer 6.

"The data reset function" in the control circuit 5 is to unconditionally set all of the parallel data signals D5 to D0 of the serial-to-parallel converting circuit 39 shown in FIG. 6 to 0 (to initialize data within the control circuit 5) in response to the signal RS outputted from the voltage detecting circuit 2 when output voltage E2 of the regulator 1 shown in FIG. 1 is lower than the reset detection voltage of the microcomputer 6. In this state, the logic in the logic circuit 40 shown in FIG. 6 outputs the signals F1 and F2 so that the switching elements 12 and 13 that control the charging and discharging operation turn off.

Figure 11:
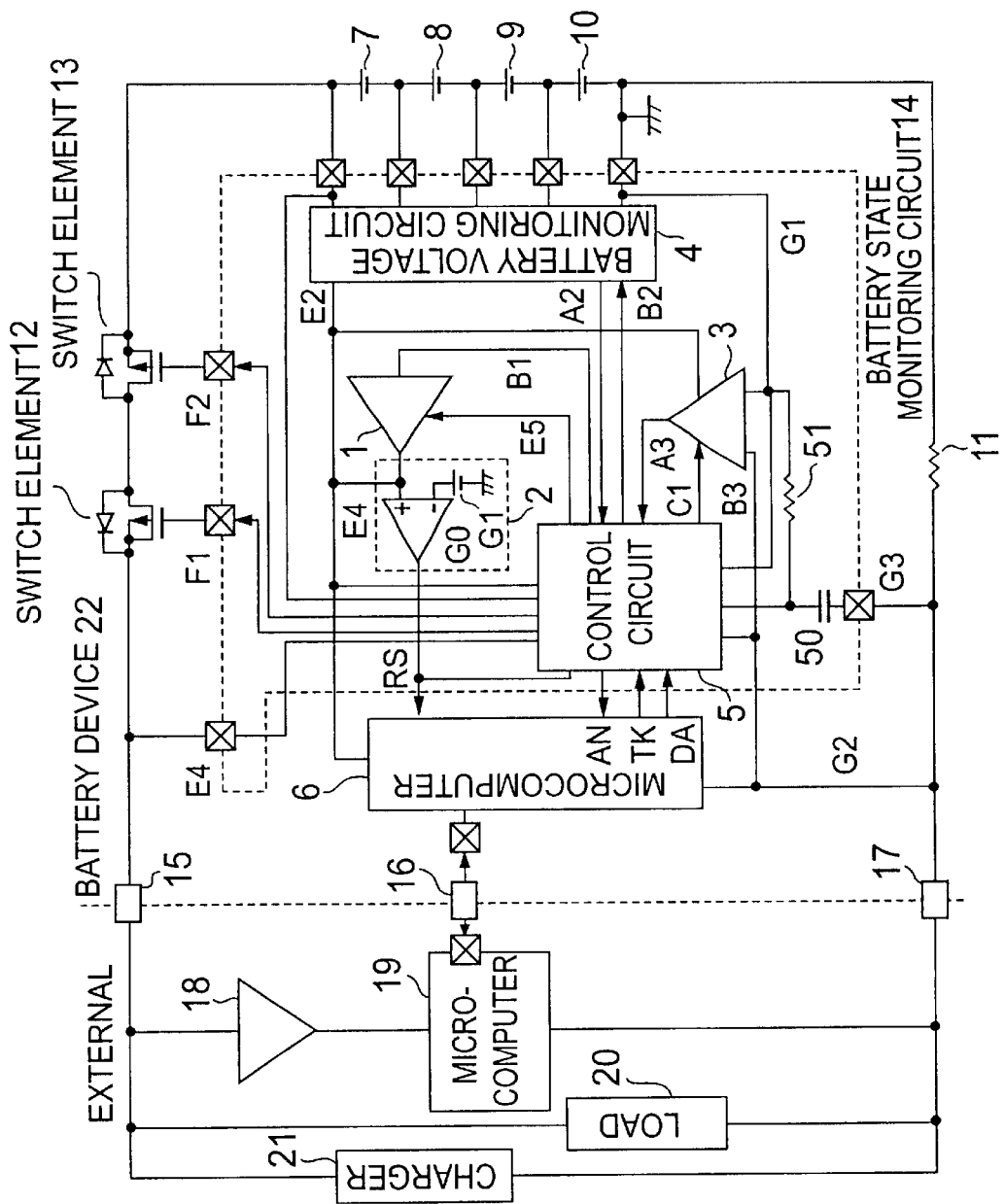
FIG. 11 is a diagram showing another example of a battery state monitoring circuit in accordance with the present invention and a battery device using the battery state monitoring circuit.

FIG. 11 shows another embodiment. In this embodiment, the microcomputer 6 is structured as parts different from the battery state monitoring circuit 14. The structural elements and the operating principle are completely identical with those in the embodiment described with reference to FIG. 1. As described above, the battery device of the present invention is effective even if one part (IC) is provided with all the functions, and the same effect is obtained even if the microcomputer, the switching elements, etc., are mounted on a substrate to provide a plurality of parts.

In the embodiments shown in FIGS. 1 and 11, the structural examples in which the respective secondary batteries 7 to 10 are connected in series to each other are described. However, the present invention is applicable to a case in which a plurality of secondary batteries are connected in parallel with each other, similarly.

In the present invention, even if the microcomputer 6 is integrated with the other circuit blocks (made into one chip) to make it difficult to discriminate the microcomputer 6 from those other circuit blocks, the circuit blocks having the function for monitoring the battery voltage, the charging current and the discharging current of the secondary batteries and the function of calculating the remaining amount of the secondary batteries from those information are applicable as the microcomputer.

INDUSTRIAL APPLICABILITY

As was described above, according to the present invention, in the battery device and the battery state monitoring circuit which are capable of calculating the remaining amount of the secondary batteries, since the current consumption can be reduced without sacrificing a precision in the detection of the charging and discharging current, there can be provided the battery device and the battery state monitoring circuit which make the current consumption from the battery device small, and accurately measure the remaining amount of the battery for a long time.

What is claimed is:

1. In a battery state monitoring circuit for controlling the charging and discharging current of a secondary battery by controlling the on/off state of switching elements connected to the secondary battery in accordance with a command signal from a microcomputer, the combination comprising: a sense resistor connected to the secondary battery; means for monitoring the charging and discharging current of the secondary battery by monitoring a voltage across the sense resistor; a circuit for reducing the current consumption of the battery state monitoring circuit by stopping operation of a portion thereof if the charging and discharging current of the secondary battery becomes equal to or lower than a given value; a control circuit for re-starting operation of the stopped portion; and an integrating circuit connected to the sense resistor for detecting the re-starting.

2. In a battery state monitoring circuit for controlling the charging and discharging current of a secondary battery by controlling the on/off state of switching elements connected to the secondary battery in accordance with a command signal from a microcomputer, the combination comprising: a sense resistor connected to the secondary battery; means for monitoring the charging and discharging current of the secondary battery by monitoring a voltage across the sense resistor; a circuit for reducing the current consumption of the battery state monitoring circuit by stopping operation of a portion thereof if the charging and discharging current of the secondary battery becomes equal to or lower than a given value; a control circuit for re-starting operation of the stopped portion; and a differentiating circuit connected to the sense resistor for differentiating a signal at a terminal of the sense resistor.

3. A battery state monitoring circuit according to claim 2; wherein the secondary battery comprises a plurality of secondary batteries connected in series.

4. A battery state monitoring circuit according to claim 2; wherein the means for monitoring the charging and discharging current of the secondary battery comprises an amplifier circuit for amplifying a voltage across the sense resistor and supplying an amplified voltage to the microcomputer for calculating the charging or discharging current of the secondary battery based on the amplified voltage.

5. A battery state monitoring circuit according to claim 4; wherein the microcomputer controls the control circuit to stop operation of all circuits of the battery state monitoring circuit except the amplifier circuit when the charging or disc harging current of the secondary battery becomes equal to or less than a predetermined value.

6. A battery state monitoring circuit according to claim 2; wherein the circuit for reducing the current consumption of the battery state monitoring circuit comprises the differentiating circuit, which differentiates a change in the charging or discharging current of the secondary battery and outputs a differentiated signal, and the microcomputer, which controls the control circuit to re-start operation of the stopped portion of the battery state monitoring circuit in response to the differentiated signal.

7. A battery circuit comprising: a secondary battery connectable to a charger and a load; switching elements connected to the secondary battery for selectively disconnecting the secondary battery from the charger and the load, respectively; a current detecting circuit having a sense resistor connected to the secondary battery and an amplifier circuit for amplifying a voltage across the sense resistor and outputting a n amplified signal used to detect a charge/discharge current of the secondary battery; a battery voltage monitoring circuit for monitoring a voltage of the secondary battery; a micrcomputer for determining the voltage and charge/discharge current of the secondary battery and calculating remaining battery capacity based on the outputs of the current detecting circuit and the battery voltage monitoring circuit, controlling the switching elements to disconnect the secondary battery from the charger or the load based on the determined voltage and current values, and outputting a signal to turn off the battery voltage detecting circuit, the current monitoring circuit and one of the switching elements when a charge/discharge current of the secondary battery is below a predetermined value; a control circuit interfacing the microcomputer with other circuits of the battery circuit; and a circuit for detecting a change in the charge/discharge current of the secondary battery and outputting a signal used to restart the battery voltage detecting circuit and the current monitoring circuit in response to the detected change.

8. A battery circuit according to claim 7; wherein the circuit for detecting a change in the charge/discharge current of the secondary battery comprises a differentiating circuit connected to the sense resistor for differentiating a voltage at a terminal of the sense resistor and supplying a differentiated output signal to the microcomputer; wherein the microcomputer outputs a signal to turn on the current detecting circuit when the differentiated output signal indicates a change in the charge/discharge current of the secondary battery.

9. A battery circuit according to claim 7; further comprising a regulator for receiving a voltage of the secondary battery and producing a regulated voltage; and a voltage detecting circuit for comparing the regulated voltage to a reference voltage and outputting a comparison signal for stopping operation of the microcomputer when the regulated voltage is below the reference voltage.

10. A battery circuit according to claim 9; wherein the control circuit has a logic circuit that outputs a logic signal for turning off the battery voltage monitoring circuit and the current detecting circuit when operation of the microcomputer is stopped.

11. A battery circuit according to claim 7; wherein the secondary battery comprises a plurality of secondary batteries connected to each other and the battery voltage monitoring circuit comprises a changeover switching circuit for selecting a respective secondary battery and an amplifier circuit connected to an output of the changeover switching circuit to convert the battery voltage to a level readable by the microcomputer.

12. A battery circuit according to claim 7; wherein the microcomputer outputs a signal to stop operation of all circuits of the battery circuit except for the current detecting circuit if the charge/discharge current becomes equal to or less than a given value.

13. A battery circuit according to claim 7; wherein the microcomputer turns off one of the switching elements when the voltage of the secondary battery is lower than a predetermined voltage to stop a charge or discharge current of the secondary battery and, when the voltage of the secondary batter has fallen below the predetermined voltage level and is thereafter rising, even when the voltage is once again above the predetermined voltage level, the switching element is kept in the off state until the microcomputer transmits a command for turning on the switching element.

* * * * *